(12) United States Patent
Murayama

(10) Patent No.: US 10,446,513 B2
(45) Date of Patent: Oct. 15, 2019

(54) CONDUCTIVE BALL HAVING A TIN-BASED SOLDER COVERING AN OUTER SURFACE OF THE COPPER BALL

(71) Applicant: SHINKO ELECTRIC INDUSTRIES CO., LTD., Nagano-shi, Nagano (JP)

(72) Inventor: Kei Murayama, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 16/023,500

(22) Filed: Jun. 29, 2018

(65) Prior Publication Data
US 2019/0013286 A1  Jan. 10, 2019

(30) Foreign Application Priority Data

Jul. 7, 2017  (JP) ................. 2017-133267

(51) Int. Cl.
| | | |
|---|---|---|
| H01L 23/00 | (2006.01) | |
| B23K 35/02 | (2006.01) | |
| B23K 35/26 | (2006.01) | |
| C22C 30/02 | (2006.01) | |
| C22C 30/04 | (2006.01) | |
| B23K 101/36 | (2006.01) | |

(52) U.S. Cl.
CPC .......... *H01L 24/13* (2013.01); *B23K 35/0244* (2013.01); *B23K 35/262* (2013.01); *C22C 30/02* (2013.01); *C22C 30/04* (2013.01); *H01L 24/11* (2013.01); *H01L 24/16* (2013.01); *H01L 24/81* (2013.01); *B23K 2101/36* (2018.08); *H01L 2224/11462* (2013.01); *H01L 2224/11464* (2013.01); *H01L 2224/13014* (2013.01); *H01L 2224/13083* (2013.01); *H01L 2224/13111* (2013.01); *H01L 2224/13113* (2013.01); *H01L 2224/13139* (2013.01); *H01L 2224/13147* (2013.01); *H01L 2224/13155* (2013.01); *H01L 2224/16145* (2013.01); *H01L 2224/16225* (2013.01); *H01L 2224/32225* (2013.01); *H01L 2224/73204* (2013.01); *H01L 2224/81815* (2013.01); *H01L 2924/014* (2013.01); *H01L 2924/15311* (2013.01); *H01L 2924/181* (2013.01)

(58) Field of Classification Search
CPC ......... H01L 24/13; H01L 24/15; H01L 24/16; H01L 2924/014; H01L 2924/15311; H01L 2924/73204; H01L 2224/13111; H01L 2224/13113; H01L 2224/13155; H01L 2224/13147
See application file for complete search history.

(56) References Cited

U.S. PATENT DOCUMENTS

| | | | |
|---|---|---|---|
| 2015/0091162 A1 | 4/2015 | Murayama | |
| 2018/0068870 A1* | 3/2018 | Tsai | ........ H01L 21/4864 |

FOREIGN PATENT DOCUMENTS

| | | |
|---|---|---|
| JP | 2013-031864 | 2/2013 |
| JP | 2015-072996 | 4/2015 |

* cited by examiner

*Primary Examiner* — Hoai V Pham
(74) *Attorney, Agent, or Firm* — Rankin, Hill & Clark LLP

(57) ABSTRACT

A conductive ball includes a copper ball, a nickel layer covering an outer surface of the copper ball, a copper layer covering an outer surface of the nickel layer, and a tin-based solder covering an outer surface of the copper layer. A copper weight of the copper layer relative to a summed weight of the tin-based solder and the copper layer is 0.7 wt % to 3 wt %.

13 Claims, 13 Drawing Sheets

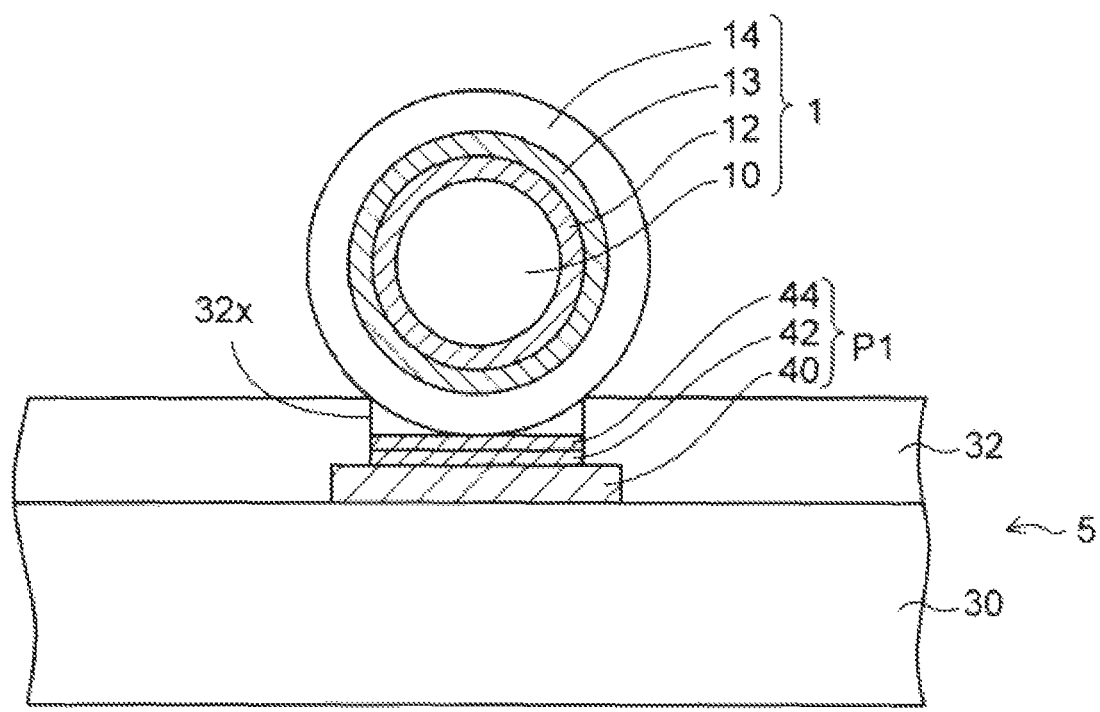

FIG. 8
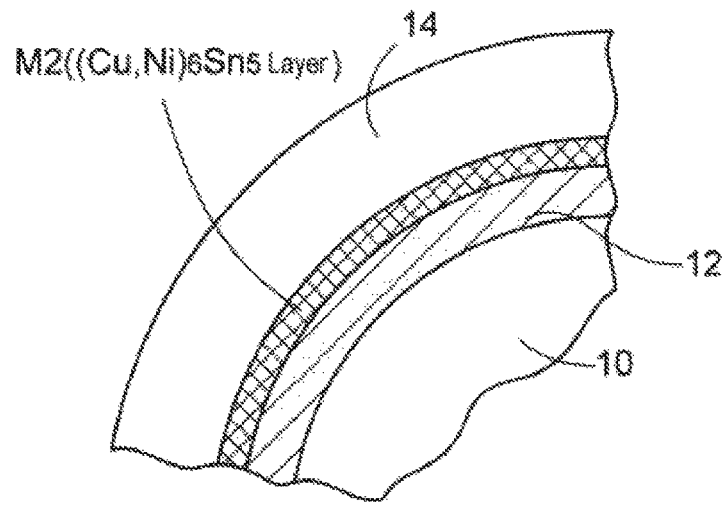
(PARTIALLY ENLARGED PLAN VIEW)
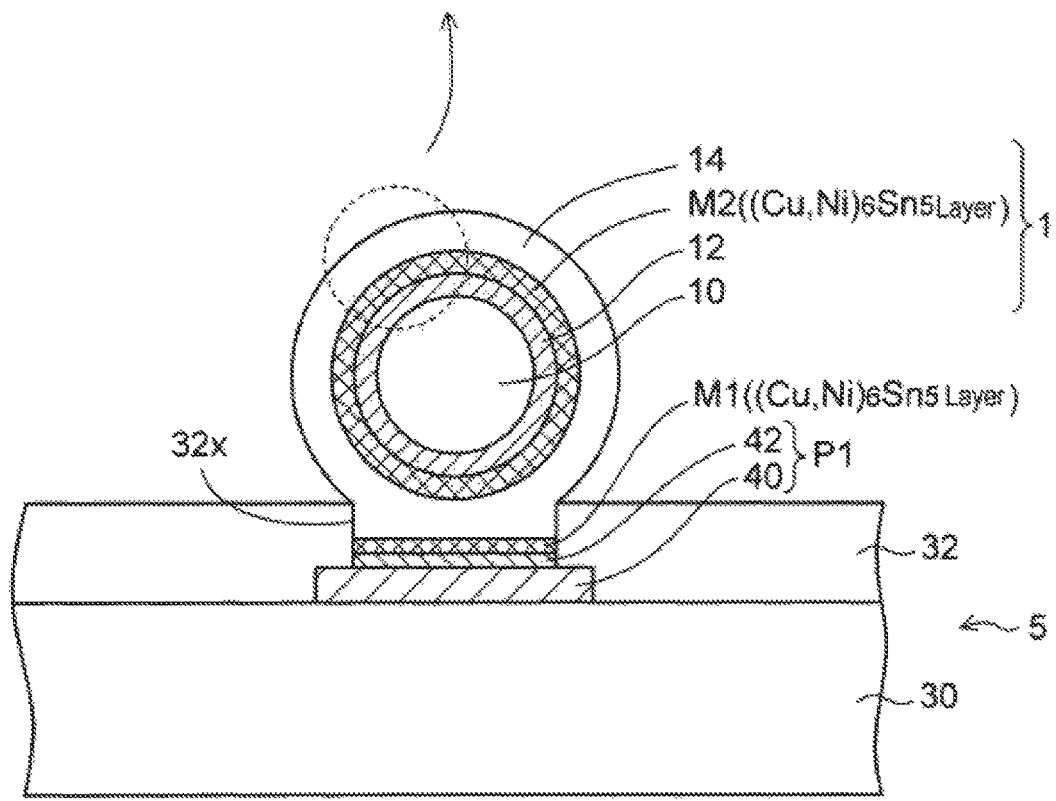

FIG. 10
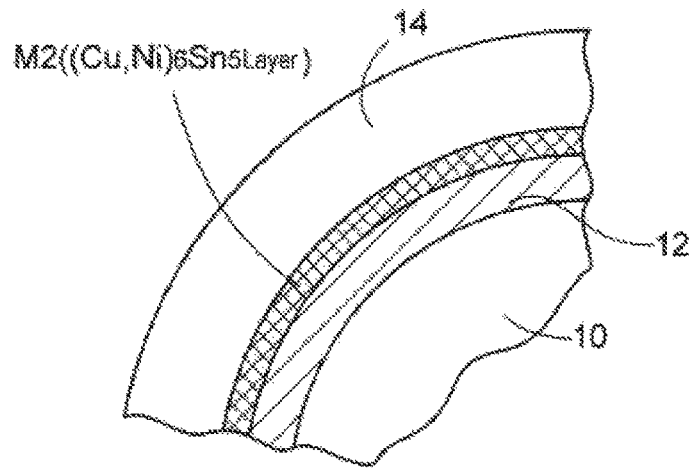
(PARTIALLY ENLARGED PLAN VIEW)
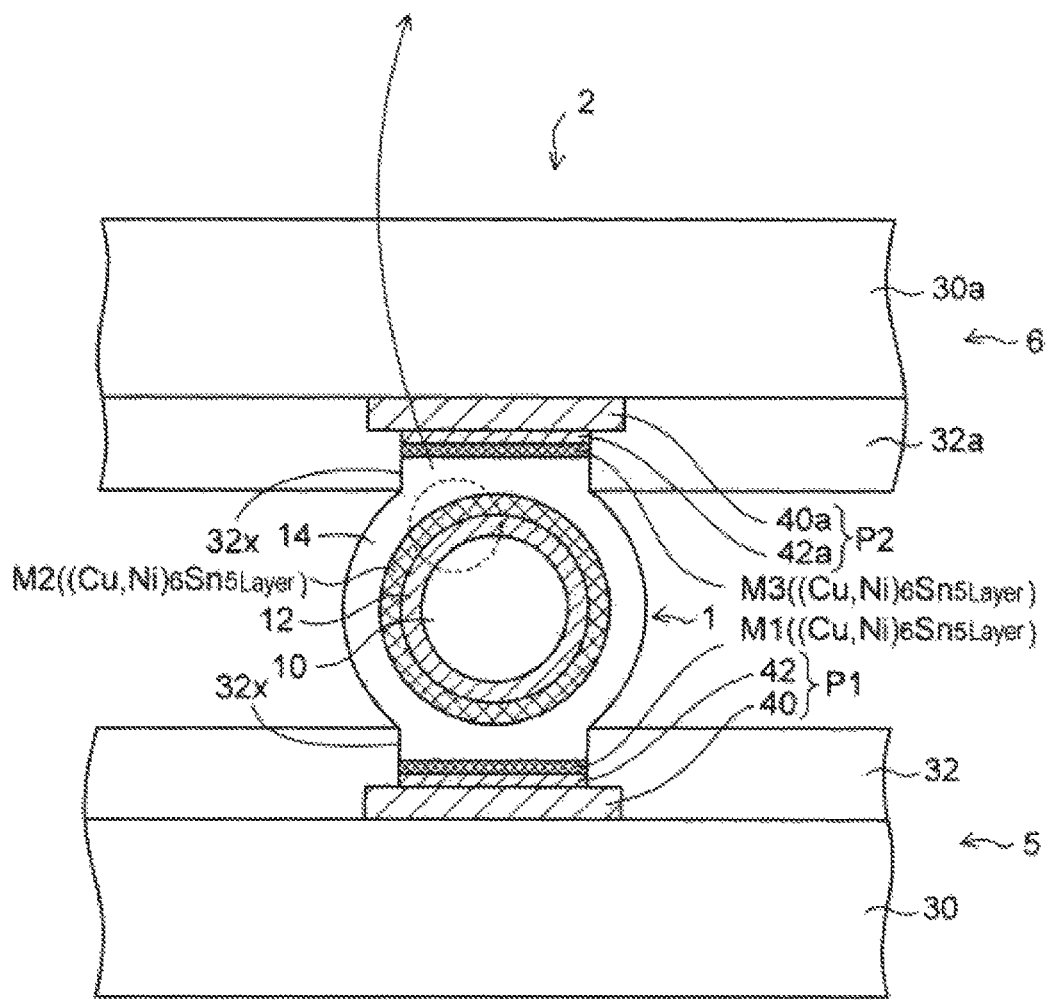

FIG. 13
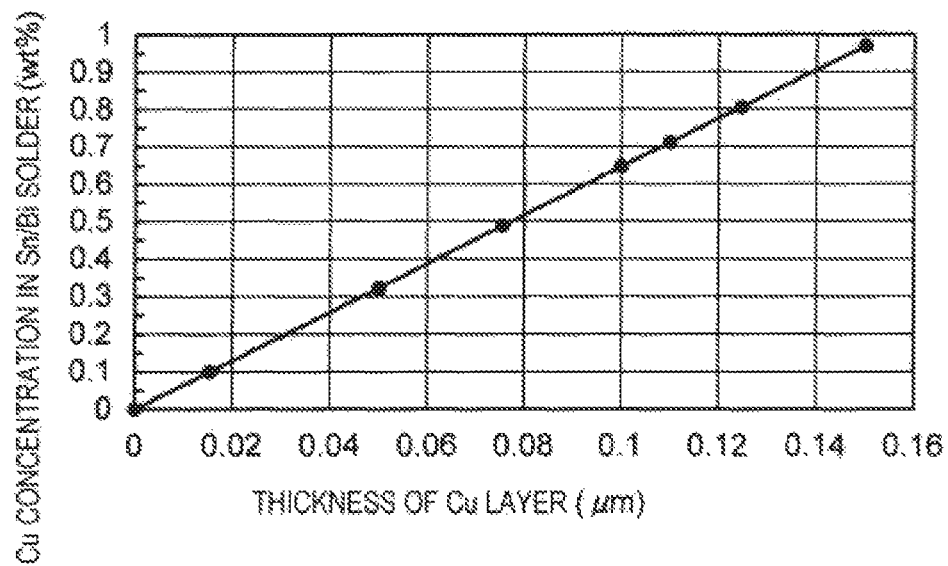
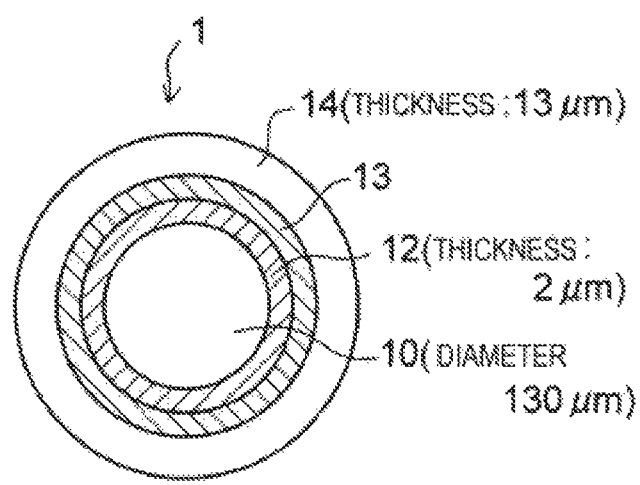

FIG. 14
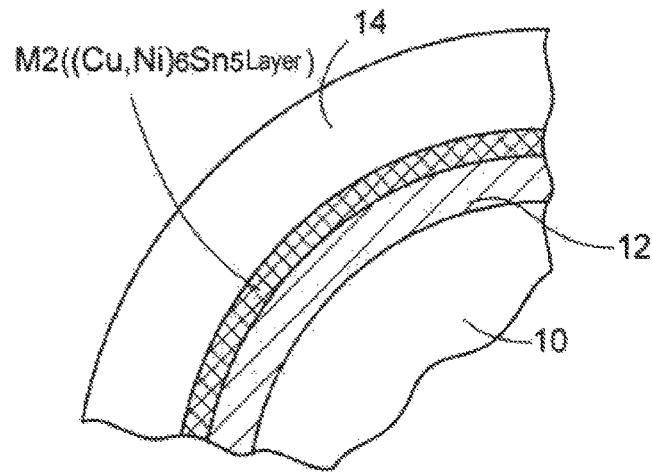
(PARTIALLY ENLARGED PLAN VIEW)
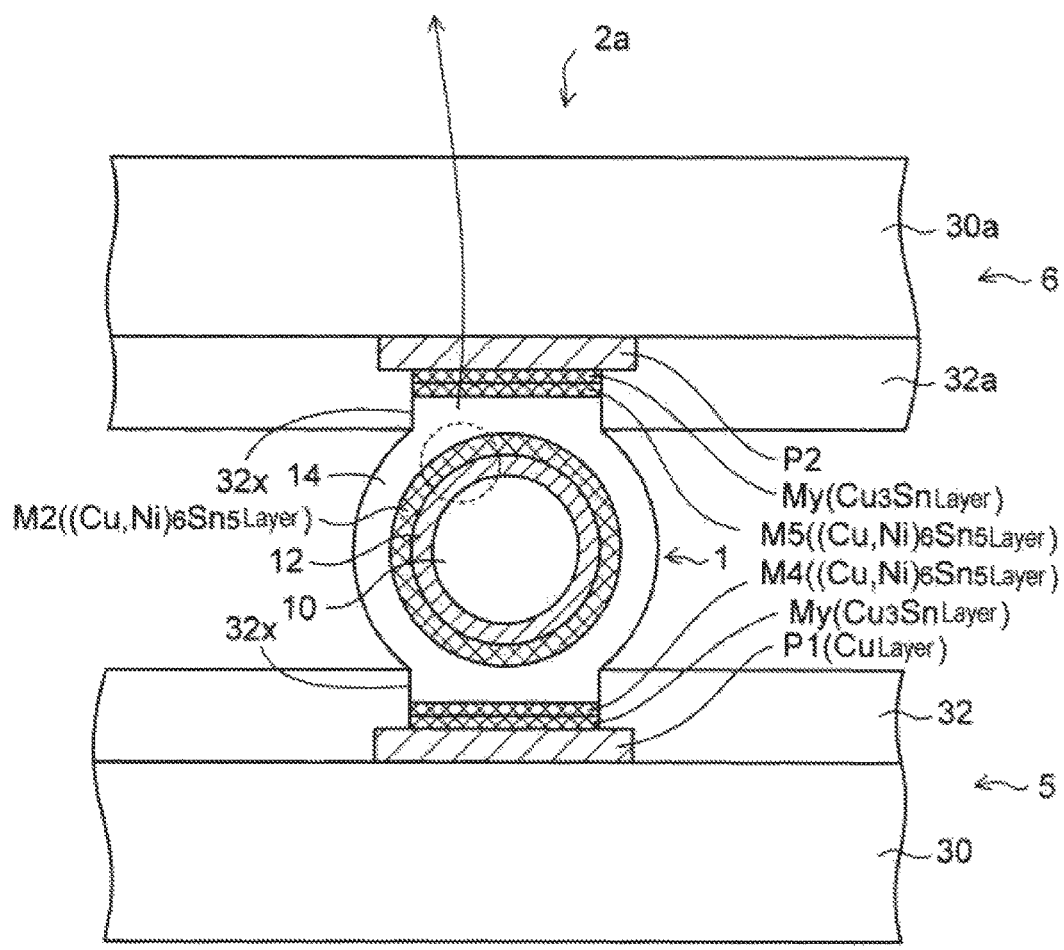

CONDUCTIVE BALL HAVING A TIN-BASED SOLDER COVERING AN OUTER SURFACE OF THE COPPER BALL

CROSS-REFERENCE TO RELATED APPLICATION

The present application claims priority from Japanese Patent Application No. 2017-133267 filed on Jul. 7, 2017, the entire content of which is incorporated herein by reference.

BACKGROUND

Technical Field

The present disclosure relates to a conductive ball and an electronic device.

Related Art

In the related art, an electronic device having a structure in which an upper wiring substrate is connected to a lower wiring substrate via conductive balls has been known. The conductive ball is formed by covering a solder on an outer surface of a copper ball.

Patent Document 1: JP-A-2013-31864
Patent Document 2: JP-A-2015-72996

As described later in paragraphs of preliminary matters, there is an electronic device in which a connection pad of a lower wiring substrate and a connection pad of an upper wiring substrate are interconnected by a conductive ball. The conductive ball is formed by sequentially covering a Ni layer and a Sn/Bi solder on an outer surface of a Cu ball.

In the electronic device, when subjecting the conductive ball to reflow heating so as to connect to each connection pad, a brittle $Ni_3Sn_4$ layer, which is thermally unstable, is formed between the connection pad and the Sn/Bi solder and between the Ni layer and the Sn/Bi solder of the conductive ball.

For this reason, when heat is applied, the $Ni_3Sn_4$ layer grows, so that a crack is generated or Ni moves by electromigration and a void is thus generated.

SUMMARY

Exemplary embodiments of the present invention provide a conductive ball having a novel structure capable of reliably connecting a lower electronic member and an upper electronic member, and an electronic device.

A conductive ball according to an exemplary embodiment comprises:
a copper ball;
a nickel layer covering an outer surface of the copper ball;
a copper layer covering an outer surface of the nickel layer, and
a tin-based solder covering an outer surface of the copper layer,
wherein a copper weight of the copper layer relative to a summed weight of the tin-based solder and the copper layer is 0.7 wt % to 3 wt %.

An electronic device according to an exemplary embodiment comprises:
a lower electronic member having a first connection pad;
an upper electronic member arranged above the lower electronic member and having a second connection pad; and
a conductive ball configured to interconnect the first connection pad of the lower electronic member and the second connection pad of the upper electronic member,
wherein the conductive ball comprises:
a copper ball,
a nickel layer covering an outer surface of the copper ball, and
a tin-based solder covering an outer surface of the nickel layer, and
wherein a $(Cu, Ni)_6Sn_5$ layer is formed between the nickel layer and the tin-based solder.

A manufacturing method of a conductive ball, according to an exemplary embodiment, comprises:
preparing a copper ball;
forming a nickel layer covering an outer surface of the copper ball;
forming a copper layer covering an outer surface of the nickel layer; and
forming a tin-based solder covering an outer surface of the copper layer,
wherein a thickness of the copper layer is adjusted so that copper in the copper layer diffuses into the tin-based solder and a concentration of copper in the tin-based solder becomes 0.7 wt % to 3 wt % when reflow heating the tin-based solder.

A manufacturing method of an electronic device, according to an exemplary embodiment, comprises:
preparing a lower electronic member, an upper electronic member and a conductive ball, the lower electronic member having a first connection pad, the upper electronic member having a second connection pad, the conductive ball comprising a copper ball, a nickel layer covering an outer surface of the copper ball, a copper layer covering an outer surface of the nickel layer, and a tin-based solder covering an outer surface of the copper layer; and
interconnecting the first connection pad of the lower electronic member and the second connection pad of the upper electronic member by reflow heating the tin-based solder of the conductive ball,
wherein a $(Cu, Ni)_6Sn_5$ layer is formed between the nickel layer and the tin-based solder of the conductive ball.

According to the present disclosure, in the conductive ball, the nickel layer, the copper layer, and the tin-based solder are covered in order on the outer surface of the copper ball. The connection pad of the lower electronic member and the connection pad of the upper electronic member are interconnected by the conductive ball.

In the conductive ball, the copper weight of the copper layer relative to the summed weight of the tin-based solder and the copper layer is 0.7 wt % to 3 wt %.

The thickness of the copper layer is adjusted so that copper in the copper layer is diffused into the tin-based solder and the concentration of copper in the tin-based solder becomes 0.7 wt % to 3 wt % when the tin-based solder is connected to the connection pad of the electronic member by the reflow heating.

Thereby, the $(Cu, Ni)_6Sn_5$ layer, which is an intermetallic compound, is formed between the nickel layer and the tin-based solder of the conductive ball and between each connection pad of the upper and lower electronic members and the tin-based solder.

Since the $(Cu, Ni)_6Sn_5$ layer has a thermally stable property and the crystal growth does not occur therein even when heat is applied thereto, a crack is prevented from being generated in a connection part. Also, since the $(Cu, Ni)_6Sn_5$ layer functions as a barrier layer having high reliability of electromigration countermeasures, a void is prevented from being generated in the connection part.

Accordingly, it is possible to improve the connection reliability by the conductive ball between the lower electronic member and the upper electronic member.

BRIEF DESCRIPTION OF THE DRAWINGS

FIG. 7 is a sectional view depicting a manufacturing method of an electronic device of the exemplary embodiment (1 thereof).

FIG. 8 is a sectional view depicting the manufacturing method of the electronic device of the exemplary embodiment (2 thereof).

FIG. 10 is a sectional view depicting a form of a connection part made by the conductive ball of the electronic device of the exemplary embodiment.

FIG. 13 illustrates a relation between a thickness of a Cu layer of the conductive ball and a Cu concentration in a Sn/Bi solder.

FIG. 14 is a sectional view depicting a form of a connection part made by the conductive ball of an electronic device of a modified embodiment.

DETAILED DESCRIPTION

Hereinafter, an exemplary embodiment will be described with reference to the accompanying drawings.

Before describing the exemplary embodiment, preliminary matters, which are bases of the present disclosure, are first described. It should be noted that the preliminary matters include personal investigation contents of the inventors and include technology contents, which are not a known technology.

Figure 1:
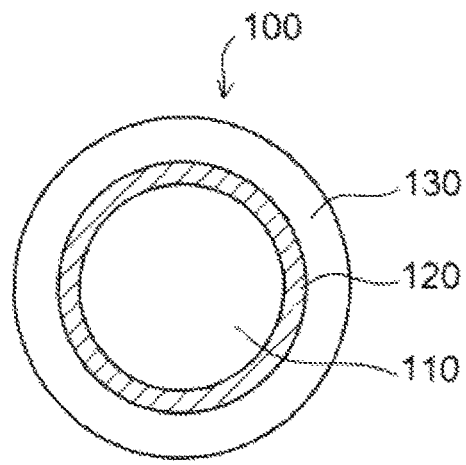
FIG. 1 is a sectional view depicting a conductive ball relating to preliminary matters.

FIG. 1 depicts a conductive ball that is to be used for an electronic device relating to the preliminary matters. As shown in FIG. 1, in a conductive ball 100, a nickel (Ni) layer 120 and a tin (Sn)/bismuth (Bi) solder 130 are formed in order on an outer surface of a copper (Cu) ball 110. The Ni layer 120 functions as a barrier layer for preventing Cu of the Cu ball 110 from diffusing into the Sn/Bi solder 130.

Figure 2:
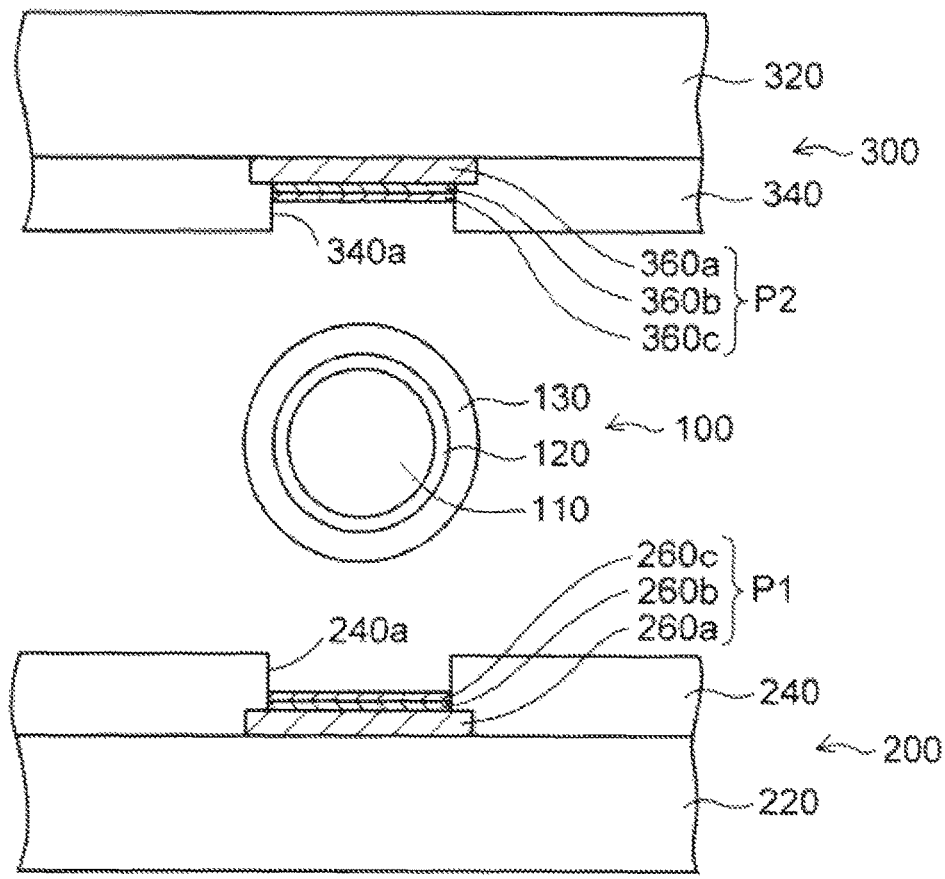
FIG. 2 is a sectional view depicting a lower wiring substrate and an upper wiring substrate, which are to be connected by the conductive ball of FIG. 1.

Subsequently, a method of interconnecting a lower wiring substrate and an upper wiring substrate by using the conductive ball 100 of FIG. 1 is described. As shown in FIG. 2, a lower wiring substrate 200 that is to be arranged at a lower side of the conductive ball 100 is first prepared. A connection pad P1 is formed on an insulation layer 220 of the lower wiring substrate 200, and a solder resist layer 240 having an opening 240a provided on the connection pad P1 is formed on the insulation layer 220.

The connection pad P1 is formed by depositing a copper (Cu) layer 260a, a nickel (Ni) layer 260b and a gold (Au) layer 260c in order from below.

Also, as shown in FIG. 2, an upper wiring substrate 300 that is to be arranged at an upper side of the conductive ball 100 is prepared. In FIG. 2, the upper wiring substrate 300 is shown with being inverted upside down.

A connection pad P2 is formed on (beneath, in FIG. 2) an insulation layer 320 of the upper wiring substrate 300, and a solder resist layer 340 having an opening 340a provided on the connection pad P2 is formed on the insulation layer 320. The connection pad P2 is formed by depositing a copper (Cu) layer 360a, a nickel (Ni) layer 360b and a gold (Au) layer 360c in order from below.

Figure 3:
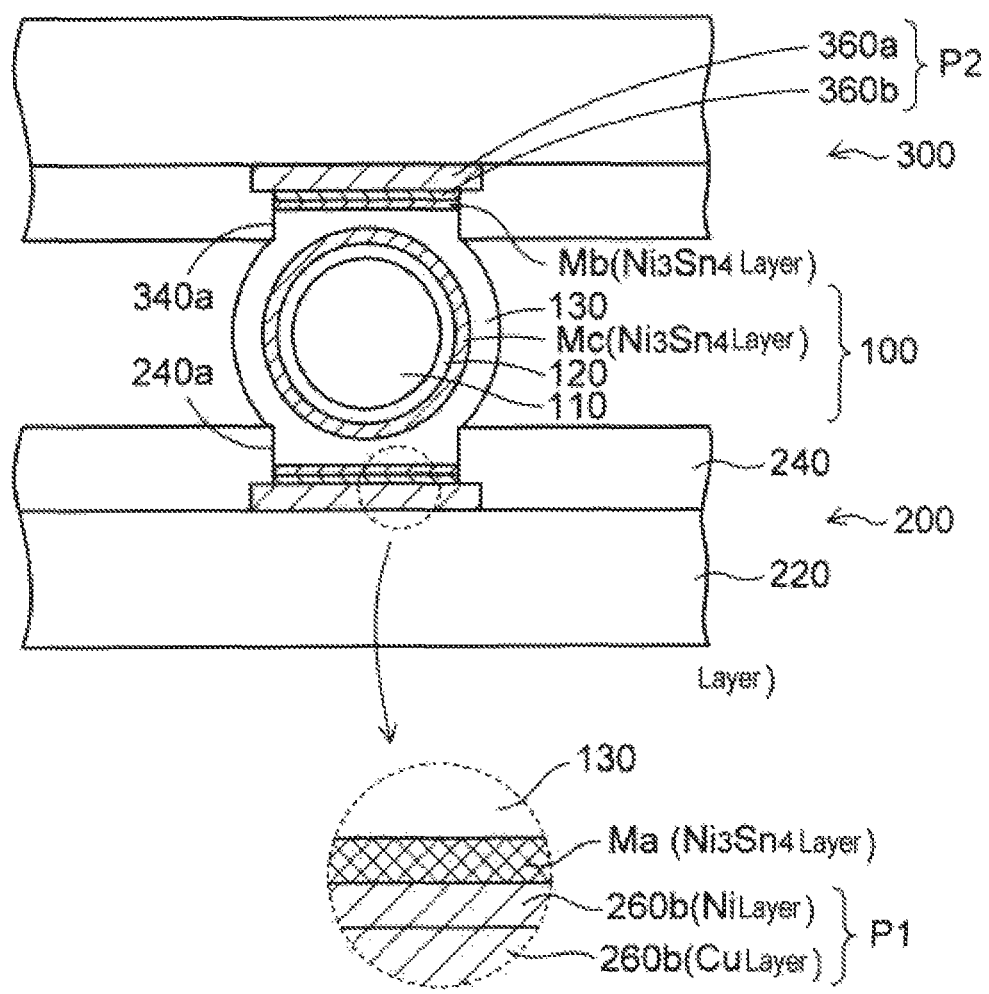
FIG. 3 is a sectional view depicting an aspect in which the upper wiring substrate is connected to the lower wiring substrate by the conductive ball relating to the preliminary matters (1 thereof).

Then, as shown in FIG. 3, the connection pad P1 of the lower wiring substrate 200 and the connection pad P2 of the upper wiring substrate 300 are interconnected by the conductive ball 100 of FIG. 1.

Actually, the conductive ball 100 is first arranged on the connection pad P1 of the lower wiring substrate 200, and the Sn/Bi solder 130 of the conductive ball 100 is connected to the connection pad P1 of the lower wiring substrate 200 by reflow heating.

Thereafter, the connection pad P2 of the upper wiring substrate 300 is arranged on the conductive ball 100 connected to the lower wiring substrate 200. Also, the connection pad P2 of the upper wiring substrate 300 is connected to the Sn/Bi solder 130 of the conductive ball 100 by the reflow heating.

At this time, during the reflow heating, the Au layer 260c of the connection pad P1 of the lower wiring substrate 200 flows into the Sn/Bi solder 130 of the conductive ball 100 and is thus lost. Also, the Au layer 360c of the connection pad P2 of the upper wiring substrate 300 flows into the Sn/Bi solder 130 of the conductive ball 100 and is thus lost.

As shown in a partially enlarged sectional view of FIG. 3, a $Ni_3Sn_4$ layer Ma is formed between the Ni layer 260b of the connection pad P1 of the lower wiring substrate 200 and the Sn/Bi solder 130 of the conductive ball 100. The $Ni_3Sn_4$ layer Ma is an intermetallic compound in which Ni in the Ni layer 260b of the connection pad P1 of the lower wiring substrate 200 and Sn in the Sn/Bi solder 130 of the conductive ball 100 are joined each other.

Also, a $Ni_3Sn_4$ layer Mb is formed between the Ni layer 360b of the connection pad P2 of the upper wiring substrate 300 and the Sn/Bi solder 130 of the conductive ball 100. The $Ni_3Sn_4$ layer Mb is an intermetallic compound in which Ni in the Ni layer 360b of the connection pad P2 of the upper wiring substrate 300 and Sn in the Sn/Bi solder 130 of the conductive ball 100 are joined each other.

Also, a $Ni_3Sn_4$ layer Mc is formed between the Ni layer 120 and the Sn/Bi solder 130 of the conductive ball 100. The $Ni_3Sn_4$ layer Mc is an intermetallic compound in which Ni in the Ni layer 120 of the conductive ball 100 and Sn in the Sn/Bi solder 130 are joined each other.

In the below, regarding problems of the electronic device of the preliminary matters, a connection part between the connection pad P1 of the lower wiring substrate 200 and the conductive ball 100 is noted.

The $Ni_3Sn_4$ layer Ma formed in the electronic device of the preliminary matters has a thermally unstable property. For this reason, when heat is applied during a thermal cycle test and the like, the $Ni_3Sn_4$ layer Ma grows, so that cracks are likely to be generated around the $Ni_3Sn_4$ layer Ma.

Also, the $Ni_3Sn_4$ layer Ma is an aggregate of acicular crystals, in which heights and widths of the respective crystals are not uniform, and has low denseness. Also, since the $Ni_3Sn_4$ layer Ma has low strength and is brittle, it is likely to be broken when stress is applied.

For this reason, when current is caused to flow, Ni in the Ni layer 260b of the connection pad P1 moves from intervals of the crystals of the $Ni_3Sn_4$ layer Ma toward the Sn/Bi solder 130 by electromigration, so that voids are likely to be formed.

Like this, since the brittle $Ni_3Sn_4$ layers Ma, Mb, Mc, which are thermally unstable, are formed in the connection parts of the conductive ball 100, the connection reliability by the conductive ball 100 between the lower wiring substrate 200 and the upper wiring substrate 300 is not secured.

Figure 4:
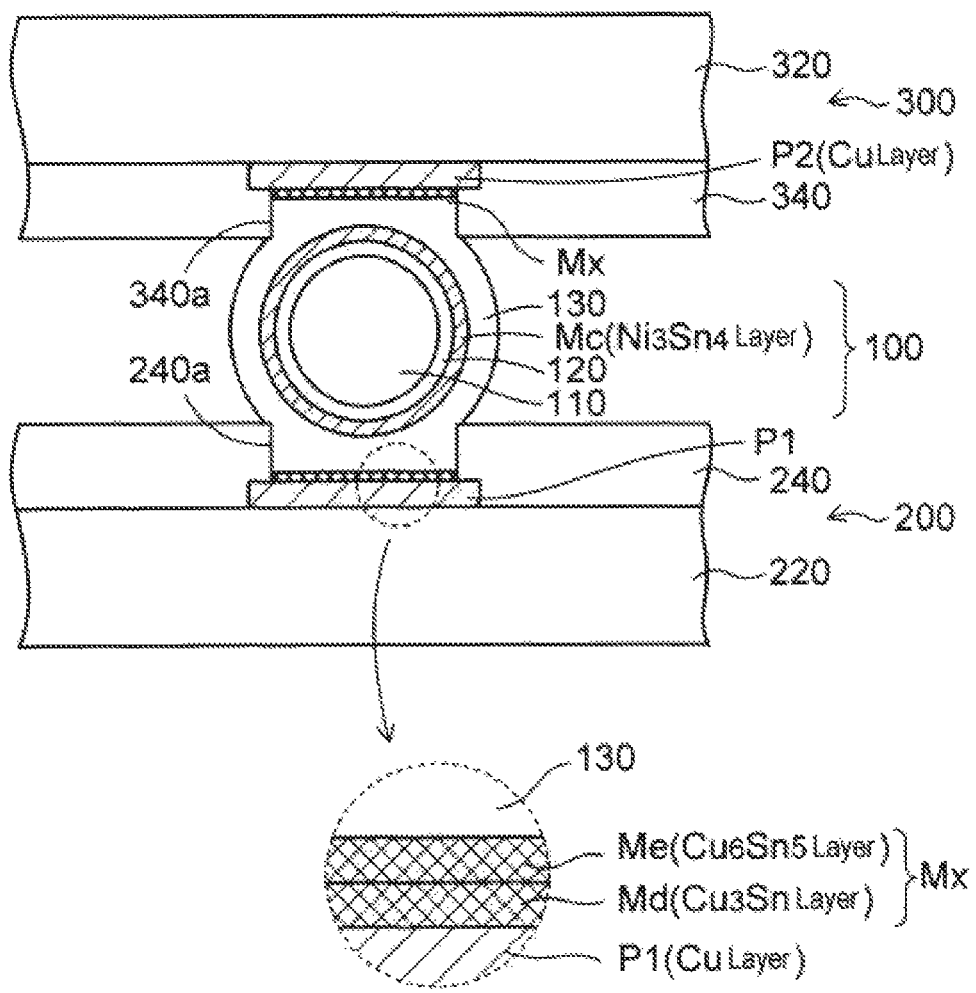
FIG. 4 is a sectional view depicting the aspect in which the upper wiring substrate is connected to the lower wiring substrate by the conductive ball relating to the preliminary matters (2 thereof).

Subsequently, a case where the connection pads P1, P2 of the lower wiring substrate 200 and the upper wiring substrate 300 are formed of Cu layers. FIG. 4 depicts an aspect where the Sn/Bi solder 130 of the conductive ball 100 of FIG. 1 is connected to the respective connection pads P1, P2 (Cu layer) of the lower wiring substrate 200 and the upper wiring substrate 300 by reflow heating.

As shown in a partially enlarged sectional view of FIG. 4, when the connection pad P1 of the lower wiring substrate 200 is formed of the Cu layer, an intermetallic compound Mx configured by a $Cu_3Sn$ layer Md and a $Cu_6Sn_5$ layer Me in order from below is formed between the connection pad P1 and the Sn/Bi solder 130 of the conductive ball 100.

Also, the same intermetallic compound Mx is formed between the connection pad P2 of the upper wiring substrate 300 and the Sn/Bi solder 130 of the conductive ball 100. Also, in the conductive ball 100, like FIG. 3, the $Ni_3Sn_4$ layer Mc is formed between the Ni layer 120 and the Sn/Bi solder 130.

When the $Cu_6Sn_5$ layer Me is formed between the connection pad P1 and the Sn/Bi solder 130, the $Cu_6Sn_5$ layer Me is transformed into a different crystal structure by temperature change and a volume thereof increases. Accordingly, cracks are generated around the $Cu_6Sn_5$ layer Me.

Like this, when the connection pad P1 is formed of the Cu layer, the unstable $Cu_6Sn_5$ layer Me is formed in the connection part of the conductive ball 100. For this reason, the connection reliability by the conductive ball 100 between the lower wiring substrate 200 and the upper wiring substrate 300 is not secured.

The above problems can be solved by manufacturing an electronic device with a conductive ball of an exemplary embodiment to be described later.

EXEMPLARY EMBODIMENT

Figure 5:
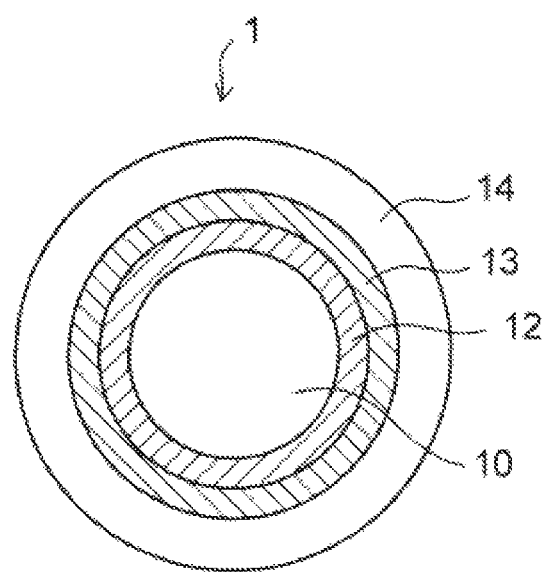
FIG. 5 is a sectional view depicting a conductive ball of an exemplary embodiment.

FIG. 5 depicts a conductive ball of an exemplary embodiment, FIGS. 6A to 6D depict a manufacturing method of the conductive ball of the exemplary embodiment, and FIGS. 7 to 10 illustrate an electronic device of the exemplary embodiment.

As shown in FIG. 5, a conductive ball 1 of the exemplary embodiment has a copper (Cu) ball 10, as a core ball. Also, a nickel (Ni) layer 12 covering an entire outer surface of the Cu ball 10 is formed.

Also, a copper (Cu) layer 13 covering an entire outer surface of the Ni layer 12 is formed. Also, a tin (Sn)/bismuth (Bi) solder 14 covering an entire outer surface of the Cu layer 13 is formed.

In this way, in the conductive ball 1 of the exemplary embodiment, the Ni layer 12, the Cu layer 13 and the Sn/Bi solder 14 are covered in corresponding order on the outer surface of the Cu ball 10.

In the conductive ball 1 of the exemplary embodiment, a copper weight of the Cu layer 13 relative to a summed weight of the Sn/Bi solder 14 and the Cu layer 13 is 0.7 wt % to 3 wt %.

As described later, the conductive ball 1 is connected to a connection pad of an electronic member by reflow heating. At this time, Cu in the Cu layer 13 is diffused into the Sn/Bi solder 14.

At this time, a thickness of the Cu layer 13 is adjusted so that Cu in the Cu layer 13 is supplied to the Sn/Bi solder 14 and thus a Cu concentration in the Sn/Bi solder 14 becomes 0.7 wt % to 3 wt %.

In a case where $r_{Cu\text{-}core}$ is radius of the Cu ball 10, $T_{Ni}$ is thickness of the Ni layer 12, $T_{Cu}$ is thickness of the Cu layer 13, and $T_{solder}$ is thickness of the Sn/Bi solder 14, the volume ($V_{Cu\text{-}core}$) of the Cu ball 10 is calculated by the following equation: $V_{Cu\text{-}core}=(4\pi/3)\times(r_{Cu\text{-}core})^3$, the volume ($V_{Ni}$) of the Ni layer 12 is calculated by the following equation: $V_{Ni}=(4\pi/3)\times[(r_{Cu\text{-}core}+T_{Ni})^3-(r_{Cu\text{-}core})^3]$, the volume ($V_{Cu}$) of the Cu layer 13 is calculated by the following equation: $V_{Cu}=(4\pi/3)\times[(r_{Cu\text{-}core}+T_{Ni}+T_{Cu})^3-(r_{Cu\text{-}core}+T_{Ni})^3]$ and the volume ($V_{solder}$) of the Sn/Bi solder 14 is calculated by the following equation: $V_{solder}=(4\pi/3)\times[(r_{Cu\text{-}core}+T_{Ni}+T_{Cu}+T_{solder})^3-(r_{Cu\text{-}core}+T_{Ni}+T_{Cu})^3]$.

In a case where $De_{Cu}$ is density of the Cu and $De_{solder}$ is density of the Sn/Bi solder 14, the Cu concentration (Cc) in the Sn/Bi solder 14 is obtained by the following equation (3):

$$C_{Cu}=100\times[(De_{Cu}\times V_{Cu})/(De_{Cu}\times V_{Cu}+De_{solder}\times V_{solder})]$$

The thickness of the Cu layer 13 is adjusted so that the Cu concentration calculated by the above equation becomes 0.7 wt % to 3 wt %.

By the above conditions, a $(Cu, Ni)_6Sn_5$ layer, which is an intermetallic compound, is formed between the Ni layer 12 and the Sn/Bi solder 14 of the conductive ball 1 and between a connection pad of an electronic member and the Sn/Bi solder 14.

The $(Cu, Ni)_6Sn_5$ layer is an intermetallic compound in which a part of the $Cu_6Sn_5$ layer shown in FIG. 4 is replaced with Ni. The $(Cu, Ni)_6Sn_5$ layer has a thermally stable property and the crystal growth does not occur therein even when heat is applied. Also, in the $(Cu, Ni)_6Sn_5$ layer, the transformation of the crystal structure due to the temperature change does not occur. Also, since the $(Cu, Ni)_6Sn_5$ layer has high strength and denseness, it functions as a barrier layer having high reliability.

The Sn/Bi solder 14 is an example of the tin-based solder. In addition, a tin (Sn)/silver (Ag) solder or a tin (Sn)/bismuth (Bi)/nickel (Ni) solder may also be used.

Since the conductive ball 1 has the Cu ball 10 that is not melted during the reflow heating, it is possible to secure a predetermined interval between the lower electronic member and the upper electronic member when interconnecting the same.

Figure 6A:
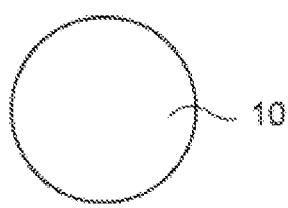
FIGS. 6A to 6D are sectional views depicting a manufacturing method of the conductive ball of the exemplary embodiment.

Subsequently, a manufacturing method of the conductive ball 1 of the exemplary embodiment of FIG. 5 is described. As shown in FIG. 6A, the Cu ball 10 is first prepared. A diameter of the Cu ball 10 is about 130 µm, for example.

Figure 6B:
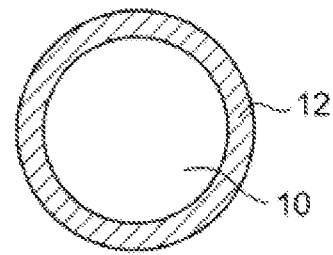

Also, as shown in FIG. 6B, the Ni layer 12 is formed on the outer surface of the Cu ball 10 by an electroless plating. The electroless plating for forming the Ni layer 12 is performed on the basis of following conditions, for example.

First, the Cu ball 10 is immersed in a mixed solution (room temperature) of caustic soda: 10 g/L and surfactant 0.5 g/L for one minute for degreasing. Continuously, the Cu ball 10 is immersed in a sulfuric acid solution (room temperature) for one minute for acid cleaning.

Then, the Cu ball 10 is treated with a mixed solution (room temperature) of palladium chloride: 2 g/L, sodium chloride: 200 g/L, and 35% HCl solution: 30 ml for 5 minutes. Thereby, Pd is applied to the outer surface of the Cu ball 10, as catalyst.

Thereafter, the Cu ball 10 is treated with an electroless plating solution (90° C.) including nickel sulfate: 20 g/L and sodium hypophosphite: 24 g/L for 15 minutes. Thereby, a Ni (P) layer of phosphorous (P) 10 wt % having a thickness of about 2 µm is formed as the Ni layer 12.

Figure 6C:
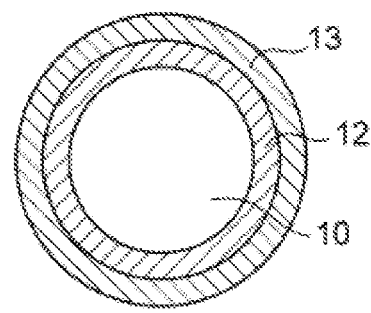

Then, as shown in FIG. 6C, the Cu layer 13 is formed on the outer surface of the Ni layer 12 covering the Cu ball 10 by an electrolytic plating. The electrolytic plating of the Cu layer 13 is performed by a barrel plating.

As conditions of the electrolytic plating, a copper sulfate plating solution is used, a current denseness is set to 1 A/dm$^2$, and treatment is performed at room temperature for 50 seconds. Thereby, the Cu layer 13 having a thickness of about 0.11 µm is formed.

Figure 6D:
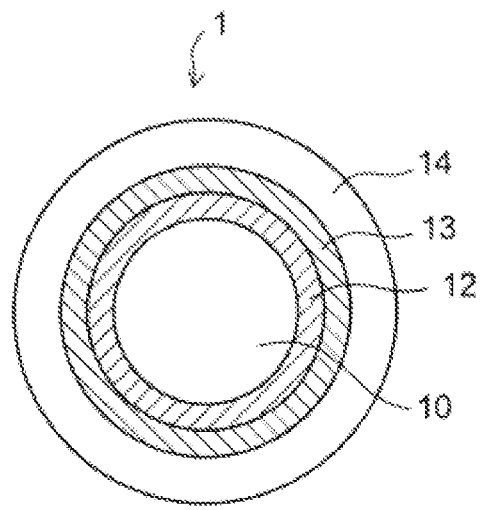

Also, as shown in FIG. 6D, the Sn/Bi solder 14 is formed on the outer surface of the Cu layer 13 covering the Cu ball 10 by the electrolytic plating. The electrolytic plating of the Sn/Bi solder 14 is performed by the barrel plating.

As conditions of the electrolytic plating, an electrolytic Sn/Bi plating solution (TB2000 (ISHIHARA CHEMICAL CO., LTD)) is used, a current denseness is set to 2 A/dm$^2$, and treatment is performed at room temperature for 10 minutes. Thereby, the Sn/Bi solder 14 having a thickness of about 12 µm is formed.

In addition to the Sn/Bi solder 14, a Sn/Ag solder or a Sn/Bi/the Ni solder may also be formed.

By the above processes, the conductive ball 1 of FIG. 5 is manufactured.

Subsequently, a method of manufacturing an electronic device by using the conductive ball 1 of FIG. 5 is described with reference to FIGS. 7 to 10.

As shown in FIG. 7, a lower electronic member 5 is first prepared. FIG. 7 partially depicts a surrounding aspect of a connection pad P1 of the lower electronic member 5. The lower electronic member 5 is a mounting substrate such as a wiring substrate, a motherboard and the like, for example.

As shown in FIG. 7, the lower electronic member 5 is formed with the connection pad P1 on an insulation layer 30. Also, a solder resist layer 32 having an opening 32x provided on the connection pad P1 is formed on the insulation layer 30.

The connection pad P1 is formed by depositing a copper (Cu) layer 40, a nickel (Ni) layer 42 and a gold (Au) layer 44 in order from below. The opening 32x of the solder resist layer 32 is arranged on the pad-shaped Cu layer 40, and an outer peripheral part of the Cu layer 40 is covered thereon with the solder resist layer 32. The Ni layer 42 and the Au layer 44 are formed on the Cu layer 40 in the opening 32x of the solder resist layer 32 by a plating.

The Cu layer 40 may be a pad electrode arranged in an island form or may be a pad electrode coupled to a leading wiring. The connection pad P1 is connected to an internal wiring layer through a via conductor formed in the insulation layer 30.

Then, the conductive ball 1 of FIG. 5 is arranged on the connection pad P1 of the lower electronic member 5. Also, as shown in FIG. 8, the reflow heating is performed to melt the Sn/Bi solder 14 of the conductive ball 1, so that the conductive ball 1 is connected to the connection pad P1 of the lower electronic member 5 by the Sn/Bi solder 14. At this time, the Sn/Bi solder 14 is reflow-heated to a temperature of about 160° C.

By the reflow heating, the Au layer 44 of the connection pad P1 of the lower electronic member 5 is caused to flow into the Sn/Bi solder 14 and is thus lost.

A $(Cu, Ni)_6Sn_5$ layer M1 is formed between the connection pad P1 of the lower electronic member 5 and the Sn/Bi solder 14 of the conductive ball 1.

During the reflow heating, Cu in the Cu layer 13 of the conductive ball 1 is diffused and supplied to the Sn/Bi solder 14. Thereby, Cu, Ni in the Ni layer 42 of the connection pad P1 and Sn in the Sn/Bi solder 14 are joined, so that the $(Cu, Ni)_6Sn_5$ layer M1 is formed.

Also, as shown in a partially enlarged sectional view of FIG. 8, a $(Cu, Ni)_6Sn_5$ layer M2 is formed between the Ni layer 12 and the Sn/Bi solder 14 of the conductive ball 1. During the reflow heating, Cu in the Cu layer 13 of the conductive ball 1 is diffused into the Sn/Bi solder 14 and the Cu layer 13 is thus lost.

At this time, Ni in the Ni layer 12 and Cu and Sn in the Sn/Bi solder 14 are joined, so that the $(Cu, Ni)_6Sn_5$ layer M2 is formed. Thereby, the outer surface of the Ni layer 12 covering the Cu ball 10 of the conductive ball 1 is entirely covered with the $(Cu, Ni)_6Sn_5$ layer M2.

Figure 9:
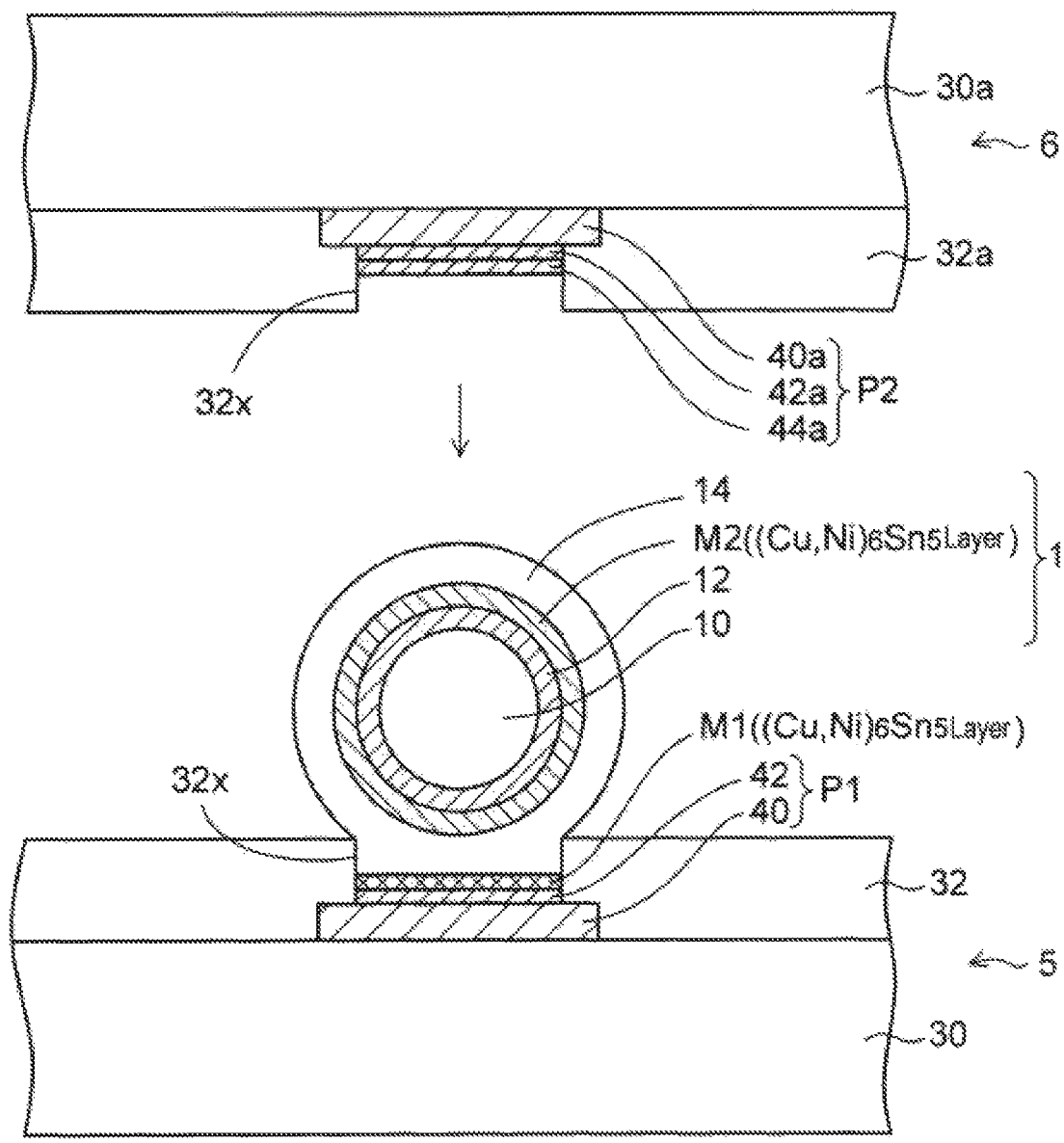
FIG. 9 is a sectional view depicting the manufacturing method of the electronic device of the exemplary embodiment (3 thereof).

Then, as shown in FIG. 9, an upper electronic member 6 that is to be arranged at an upper side of the conductive ball 1 is prepared. The upper electronic member 6 is an electronic component such as a wiring substrate, a semiconductor chip or the like, for example. In FIG. 9, the upper electronic member 6 is shown with being inverted upside down.

In the upper electronic member 6, a connection pad P2 is formed on (beneath, in FIG. 9) an insulation layer 30a, and a solder resist layer 32a having an opening 32x provided on the connection pad P2 is formed on the insulation layer 30a. The connection pad P2 is formed by depositing a copper (Cu) layer 40a, a nickel (Ni) layer 42a and a gold (Au) layer 44a in order from below.

Then, the connection pad P2 of the upper electronic member 6 is arranged on the conductive ball 1 connected to the connection pad P1 of the lower electronic member 5.

Continuously, as shown in FIG. 10, the reflow heating is performed to melt the Sn/Bi solder 14 of the conductive ball 1, so that the connection pad P2 of the upper electronic member 6 is connected to the Sn/Bi solder 14 of the conductive ball 1.

At this time, like the lower electronic member 5, the Au layer 44a of the connection pad P2 of the upper electronic member 6 is caused to flow into the Sn/Bi solder 14 and is thus lost by the reflow heating.

Then, like the lower electronic member 5, a $(Cu, Ni)_6Sn_5$ layer M3 is formed between the Ni layer 42a of the connection pad P2 of the upper electronic member 6 and the Sn/Bi solder 14.

Like the lower electronic member 5, during the reflow heating, Cu in the Cu layer 13 of the conductive ball 1 is diffused and supplied to the Sn/Bi solder 14. Thereby, Cu, Ni in the Ni layer 42a of the connection pad P2 and Sn in the Sn/Bi solder 14 are joined, so that the (Cu, Ni)$_6$Sn$_5$ layer M3 is formed.

In this way, the connection pad P1 of the lower electronic member 5 is connected to the connection pad P2 of the upper electronic member 6 by the conductive ball 1. Since the Cu ball 10 of the conductive ball 1 is not melted when reflow heating the Sn/Bi solder 14, it is possible to secure a predetermined interval between the lower electronic member 5 and the upper electronic member 6.

In the above example, after connecting the conductive ball 1 to the first connection pad P1 of the lower electronic member 5, the connection pad P2 of the upper electronic member 6 is connected to the conductive ball 1. To the contrary, after connecting the conductive ball 1 to the connection pad P2 of the upper electronic member 6, the connection pad P1 of the lower electronic member 5 may be connected to the conductive ball 1.

Alternatively, in a state where the conductive ball 1 is arranged between the connection pad P1 of the lower electronic member 5 and the connection pad P2 of the upper electronic member 6, both may be connected at the same time by collectively performing the reflow heating.

In this way, the connection pad P1 of the lower electronic member 5 and the connection pad P2 of the upper electronic member 6 are connected by reflow heating the Sn/Bi solder 14 of the conductive ball 1.

By the above processes, as shown in FIG. 10, an electronic device 2 of the exemplary embodiment is obtained. As shown in FIG. 10, the electronic device 2 of the exemplary embodiment has the lower electronic member 5. In the lower electronic member 5, the connection pad P is formed on the insulation layer 30. Also, the solder resist layer 32 having the opening 32x provided on the connection pad P1 is formed on the insulation layer 30.

The connection pad P1 is formed by the Cu layer 40 and the Ni layer 42 arranged thereon. A surface of the connection pad P1 is formed as the Ni layer 42.

The opening 32x of the solder resist layer 32 is arranged on the pad-shaped Cu layer 40, and an outer peripheral part of the Cu layer 40 is covered thereon with the solder resist layer 32. The Ni layer 42 is formed on the Cu layer 40 in the opening 32x of the solder resist layer 32.

Also, the conductive ball 1 is connected to the connection pad P1 of the lower electronic member 5. The conductive ball 1 has the Cu ball 10, the Ni layer 12 covering the outer surface of the Cu ball 10, and the Sn/Bi solder 14 covering the outer surface of the Ni layer 12.

The (Cu, Ni)$_6$Sn$_5$ layer M1 is formed between the Ni layer 42 of the connection pad P1 of the lower electronic member 5 and the Sn/Bi solder 14 of the conductive ball 1. As described above, the (Cu, Ni)$_6$Sn$_5$ layer M1 is an intermetallic compound in which Cu supplied from the Cu layer 13 of the conductive ball 1, Ni in the Ni layer 42 of the connection pad P1 and Sn in the Sn/Bi solder 14 are joined one another.

Also, the electronic device 2 of the exemplary embodiment has the upper electronic member 6 arranged above the lower electronic member 5. The conductive ball 1 is arranged between the connection pad P1 of the lower electronic member 5 and the connection pad P2 of the upper electronic member 6, and the connection pad P1 and the second connection pad P2 are interconnected by the conductive ball 1.

In this way, the lower electronic member 5 is connected to the upper electronic member 6 by the conductive ball 1. The upper electronic member 6 is inverted upside down.

In the upper electronic member 6, the connection pad P2 is formed on (beneath, in FIG. 10) the insulation layer 30a. Also, the solder resist layer 32a having the opening 32x provided on the connection pad P2 is formed on the insulation layer 30a.

Like the lower electronic member 5, the connection pad P2 is formed by the Cu layer 40a and the Ni layer 42a arranged thereon. The opening 32x of the solder resist layer 32a is arranged on the pad-shaped Cu layer 40a, and an outer peripheral part of the Cu layer 40a is covered thereon with the solder resist layer 32a. The Ni layer 42a is formed on the Cu layer 40a in the opening 32x of the solder resist layer 32a.

Also, like the lower electronic member 5, the (Cu, Ni)$_6$Sn$_5$ layer M3 is formed between the Ni layer 42a of the connection pad P2 of the upper electronic member 6 and the Sn/Bi solder 14 of the conductive ball 1. Like the lower electronic member 5, the (Cu, Ni)$_6$Sn$_5$ layer M3 is an intermetallic compound in which Cu supplied from the Cu layer 13 of the conductive ball 1, Ni in the Ni layer 42a of the connection pad P2 and Sn in the Sn/Bi solder 14 are joined one another.

Like this, in the electronic device 2 of the exemplary embodiment, the (Cu, Ni)$_6$Sn$_5$ layer M1, which is an intermetallic compound, is formed between the Ni layer 42 of the connection pad P1 of the lower electronic member 5 and the Sn/Bi solder 14 of the conductive ball 1.

The (Cu, Ni)$_6$Sn$_5$ layer M1 has a thermally stable property, unlike the Ni$_3$Sn$_4$ layer Ma described in the preliminary matters. For this reason, even when heat is applied during a thermal cycle test and the like, the crystal growth does not occur. Also, in the (Cu, Ni)$_6$Sn$_5$ layer M1, the transformation of the crystal structure due to the temperature change does not occur, unlike the Cu$_6$Sn$_5$ layer Me described in the preliminary matters. For this reason, the cracks are prevented from being generated around the (Cu, Ni)$_6$Sn$_5$ layer M1.

Also, the (Cu, Ni)$_6$Sn$_5$ layer M1 is an aggregate of dome-shaped crystals, in which heights and widths of the respective crystals are uniform, and has high denseness, unlike the Ni$_3$Sn$_4$ layer Ma described in the preliminary matters. Also, the (Cu, Ni)$_6$Sn$_5$ layer M1 has high strength, so that it is difficult to be broken even when stress is applied thereto.

For this reason, the (Cu, Ni)$_6$Sn$_5$ layer M1 functions as a barrier layer having high reliability. Thereby, Ni in the Ni layer 42 of the connection pad P1 of the lower electronic member 5 is suppressed from moving by the electromigration, so that a void is prevented from being generated in the connection part made by the conductive ball 1.

Also, the (Cu, Ni)$_6$Sn$_5$ layer M3 is formed between the Ni layer 42a of the connection pad P2 of the upper electronic member 6 and the Sn/Bi solder 14 of the conductive ball 1. For this reason, due to the similar reasons, it is possible to improve the connection reliability between the connection pad P2 of the upper electronic member 6 and the conductive ball 1.

Also, referring to a partially enlarged sectional view of FIG. 10, the (Cu, Ni)$_6$Sn$_5$ layer M2 is formed between the Ni layer 12 and the Sn/Bi solder 14 of the conductive ball 1. As described above, the (Cu, Ni)$_6$Sn$_5$ layer M2 is an intermetallic compound in which Cu supplied from the Cu layer 13, Ni in the Ni layer 12 and Sn in the Sn/Bi solder 14 are joined one another.

In this way, the (Cu, Ni)$_6$Sn$_5$ layer M2 is formed on the entire outer surface of the Ni layer 12 covering the Cu ball 10 of the conductive ball 1.

Also in the (Cu, Ni)$_6$Sn$_5$ layer M2 formed in the conductive ball 1, since the crystal growth and the transformation do not occur, as described above, the crack is prevented from being generated in the connection part made by the conductive ball 1.

Also, Ni in the Ni layer 12 of the conductive ball 1 is suppressed from moving by the electromigration, so that a void is prevented from being generated in the connection part made by the conductive ball 1.

Meanwhile, in FIG. 10, the (Cu, Ni)$_6$Sn$_5$ layer M2 formed in the conductive ball 1 and the (Cu, Ni)$_6$Sn$_5$ layer M1 formed in the connection pad P1 may be formed with being in contact with each other. Also, the (Cu, Ni)$_6$Sn$_5$ layer M2 formed in the conductive ball 1 and the (Cu, Ni)$_6$Sn$_5$ layer M3 formed in the connection pad P2 may be formed with being in contact with each other.

Here, conditions at which the (Cu, Ni)$_6$Sn$_5$ layers M1 to M3 are formed on the Ni layers 42, 42a of the connection pads P1, P2 of the lower electronic member 5 and the upper electronic member 6 and on the Ni layer 12 of the conductive ball 1 are described.

When reflow heating the conductive ball 1 for connection, Cu in the Cu layer 13 of the conductive ball 1 is diffused into the Sn/Bi solder 14. At this time, the Cu concentration in the Sn/Bi solder 14 is adjusted to be within a range of 0.7 wt % to 3 wt %, so that the (Cu, Ni)$_6$Sn$_5$ layers M1 to M3 are formed.

The inventors performed a test for checking whether the (Cu, Ni)$_6$Sn$_5$ layer is actually formed by the above conditions.

Figure 11:
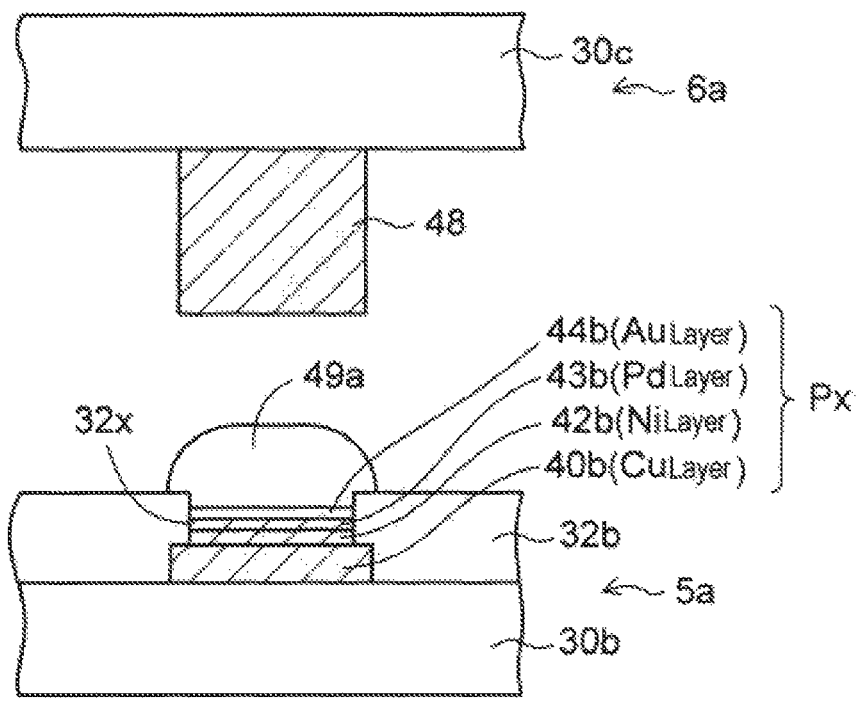
FIG. 11 is a sectional view depicting a test sample for checking an intermetallic compound (1 thereof).

As shown in FIG. 11, as a test sample, a lower substrate 5a and an upper substrate 6a were prepared. In the lower substrate 5a, a pad-shaped Cu layer 40b was formed on an insulation layer 30b, and a solder resist layer 32b having an opening 32x provided on the Cu layer 40b was formed.

Also, a Ni layer 42b, a Pd layer 43b and an Au layer 44b were formed on the Cu layer 40b in the opening 32x of the solder resist layer 32. A connection pad Px was formed by the Cu layer 40b, the Ni layer 42b, the Pd layer 43b and the Au layer 44b. Also, in the upper substrate 6a, a Cu pillar 48 was formed on an insulation layer 30c.

Then, a solder paste 49a of 96 wt % Sn/3.5 wt % Ag/0.5 wt % Cu was applied onto the connection pad Px of the lower substrate 5a.

The test sample is a pseudo test of the connection structure of FIG. 10, and the Cu pillar 48 of the upper substrate 6a corresponds to the Cu layer 13 of the conductive ball 1 (FIG. 5) and the solder paste 49a corresponds to the Sn/Bi solder 14 of the conductive ball 1.

Figure 12:
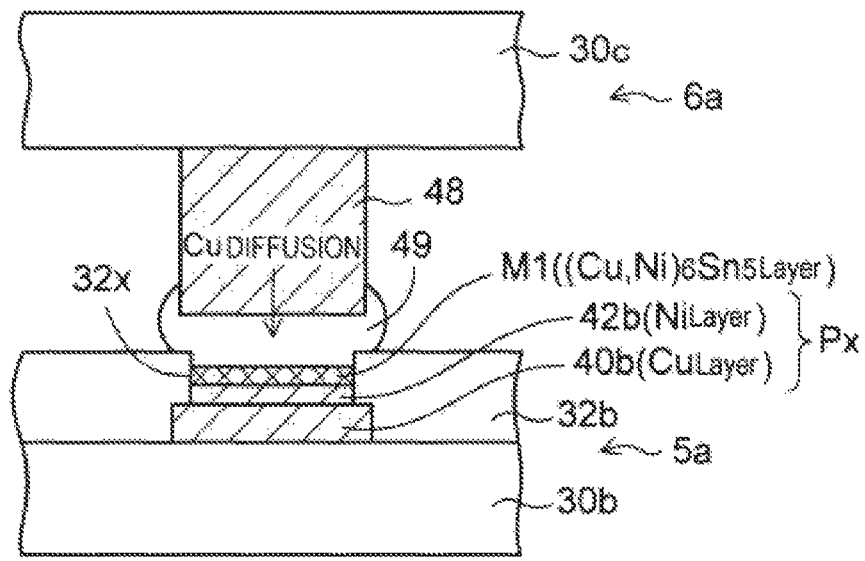
FIG. 12 is a sectional view depicting the test sample for checking the intermetallic compound (2 thereof).

Then, as shown in FIG. 12, the Cu pillar 48 of the upper substrate 6a was arranged on the solder paste 49a on the connection pad Px of the lower substrate 5a, and the reflow heating was performed. Thereby, the Cu pillar 48 of the upper substrate 6a was connected to the connection pad Px of the lower substrate 5a by a solder 49.

At this time, the Au layer 44b and Pd layer 43b of the connection pad Px flowed into the solder paste 49a and were thus lost. Also, Cu in the Cu pillar 48 was diffused into the solder paste 49a, so that the Cu concentration in the solder paste 49a was increased from 0.5 wt % to 0.7 wt %.

Thereby, a (Cu, Ni)$_6$Sn$_5$ layer M1 was formed between the Ni layer 42b of the connection pad Px of the lower substrate 5a and the solder 49.

The inventors analyzed the layer denoted with M1 in FIG. 12 by EDX (energy dispersive X-ray analysis) and confirmed that the layer denoted with M1 was the (Cu, Ni)$_6$Sn$_5$ layer.

Like this, it was confirmed that the (Cu, Ni)$_6$Sn$_5$ layer was formed by adjusting the Cu concentration in the Sn/Bi solder 14 to a range of 0.7 wt % to 3 wt % by the diffusion of Cu from the Cu layer 13 of the conductive ball 1.

FIG. 13 depicts a relation between the thickness (μm) of the Cu layer 13 of the conductive ball 1 of FIG. 5 and the Cu concentration (wt %) in the Sn/Bi solder 14.

For example, like the conductive ball 1 shown in FIG. 13, a diameter of the Cu ball 10 is set to 130 μm, the thickness of the Ni layer 12 is set to 2 μm, and the thickness of the Sn/Bi solder 14 is set to 13 μm.

In this case, as shown in a graph of FIG. 13, when the Cu layer 13 of the conductive ball 1 has a thickness of about 0.11 μm shown in FIG. 13, the Cu concentration in the Sn/Bi solder 14 is 0.7 wt %. At this time, Cu in the Cu layer 13 is diffused into the Sn/Bi solder 14, so that the Cu layer 13 is lost.

Like this example, the thickness of the Cu layer 13 is preferably adjusted in correspondence to the diameter of the Cu ball 10 and the respective thicknesses of the Ni layer 12 and the Sn/Bi solder 14 so that the Cu concentration in the Sn/Bi solder 14 is within the range of 0.7 wt % to 3 wt % during the reflow heating.

Subsequently, an electronic device of a modified embodiment of the exemplary embodiment is described. FIG. 14 depicts an electronic device of a modified embodiment of the exemplary embodiment. As shown in FIG. 14, in an electronic device 2a of the modified embodiment, the respective connection pads P1, P2 of the lower electronic member 5 and the upper electronic member 6 are formed of the Cu layers without the Ni layer and the Au layer.

FIG. 14 depicts an aspect in which the Sn/Bi solder 14 of the conductive ball 1 of FIG. 5 is connected to the respective connection pads P1, P2 (Cu layers) of the lower electronic member 5 and the upper electronic member 6 by the reflow heating.

As shown in FIG. 14, in the electronic device 2a of the modified embodiment, a Cu$_3$Sn layer My and a (Cu, Ni)$_6$Sn$_5$ layer M4 are formed in order from below between the connection pad P1 (Cu layer) of the lower electronic member 5 and the Sn/Bi solder 14 of the conductive ball 1. Cu in the connection pad P1 (Cu layer) of the lower electronic member 5 and Sn in the Sn/Bi solder 14 are joined each other, so that the Cu$_3$Sn layer My is formed on the connection pad P1.

Also, Cu in the Cu layer 13 of the conductive ball 1 and Ni in the Ni layer 12 are diffused into the Sn/Bi solder 14, so that Cu, Ni and Sn are joined one another and the (Cu, Ni)$_6$Sn$_5$ layer M4 is thus formed on the Cu$_3$Sn layer My on the connection pad P1. After Cu in the Cu layer 13 is all diffused into the Sn/Bi solder 14, Ni is supplied from the exposed Ni layer 12.

Also, a Cu$_3$Sn layer My and a (Cu, Ni)$_6$Sn$_5$ layer M5 are formed in order from below between the connection pad P2 (Cu layer) of the upper electronic member 6 and the Sn/Bi solder 14 of the conductive ball 1.

Cu in the connection pad P2 (Cu layer) of the upper electronic member 6 and Sn in the Sn/Bi solder 14 of the conductive ball 1 are joined each other, so that the Cu$_3$Sn layer My is formed on the connection pad P2.

Also, Cu in the Cu layer 13 of the conductive ball 1 and Ni in the Ni layer 12 are diffused into the Sn/Bi solder 14, so that Cu, Ni and Sn are joined one another and the (Cu, Ni)$_6$Sn$_5$ layer M5 is thus formed on the Cu$_3$Sn layer My on the connection pad P2.

Also, in the conductive ball 1, like FIG. 10, the (Cu, Ni)$_6$Sn$_5$ layer M2 is formed between the Ni layer 12 and the Sn/Bi solder 14.

FIG. 14 is the same as FIG. 10, except that the Cu$_3$Sn layer My and the (Cu, Ni)$_6$Sn$_5$ layers M4, M5 are formed on the respective connection pads P1, P2 (Cu layer) of the lower electronic member 5 and the upper electronic member 6. For this reason, the other elements of FIG. 14 are denoted with the same reference numerals as FIG. 10, and the detailed descriptions thereof are omitted.

In the electronic device 2a of the modified embodiment, since the respective connection pads P1, P2 of the lower electronic member 5 and the upper electronic member 6 do not have the Ni layer, Ni is supplied from the Ni layer 12 of the conductive ball 1, so that the (Cu, Ni)$_6$Sn$_5$ layers M4, M5 are formed.

At this time, after Cu in the copper layer 13 of the conductive ball 1 is all diffused, Ni is supplied from the Ni layer 12. For this reason, the copper layer 13 is set to have a minimum thickness and the treatment time and temperature of the reflow heating are optimally adjusted so that Ni is to be sufficiently supplied.

In the electronic device 2a of the modified embodiment, like the electronic device 2 of FIG. 10, the thermally stable (Cu, Ni)$_6$Sn$_5$ layers M4, M5, M2 are formed between the connection pads P1, P2 (Cu layer) and the Sn/Bi solder 14 and between the Ni layer 12 and the Sn/Bi solder 14 of the conductive ball 1.

For this reason, it is possible to improve the connection reliability by the conductive ball 1 between the lower electronic member 5 and the upper electronic member 6.

In FIGS. 10 and 14, even when a Sn/Ag solder or a Sn/Bi/Ni solder is used instead of the Sn/Bi solder 14 of the conductive ball 1, the similar intermetallic compound is formed.

Meanwhile, in FIG. 14, the (Cu, Ni)$_6$Sn$_5$ layer M2 formed in the conductive ball 1 and the (Cu, Ni)$_6$Sn$_5$ layer M4 formed in the connection pad P1 may be formed with being in contact with each other. Also, the (Cu, Ni)$_6$Sn$_5$ layer M2 formed in the conductive ball 1 and the (Cu, Ni)$_6$Sn$_5$ layer M5 formed in the connection pad P2 may be formed with being in contact with each other.

Subsequently, an electronic device of the exemplary embodiment to which the connection structure by the conductive ball of FIG. 5 is applied is described.

Figure 15:
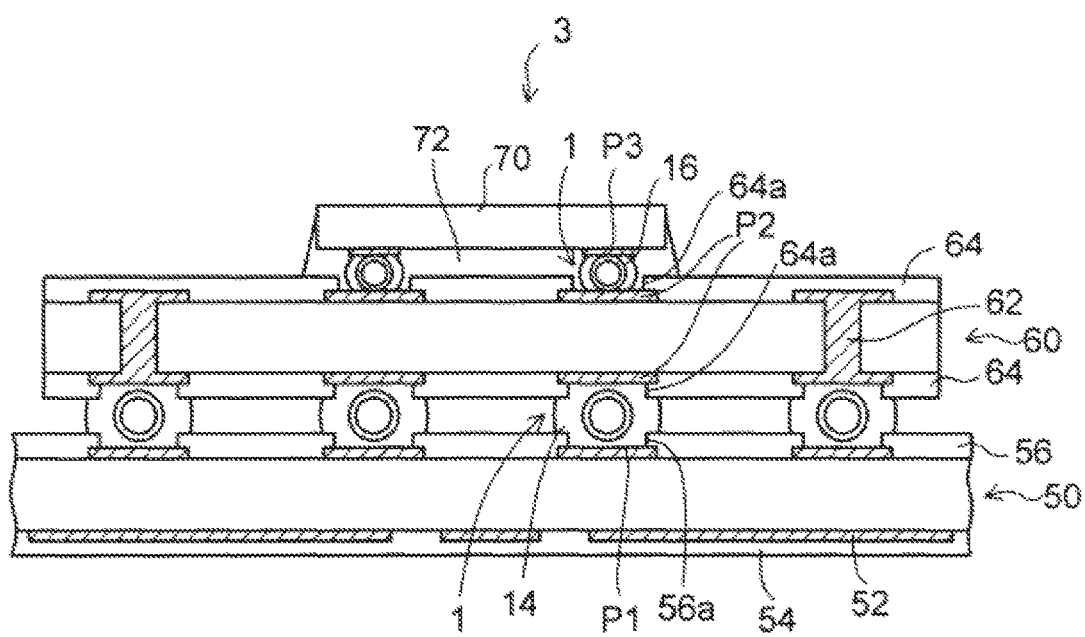
FIG. 15 is a sectional view depicting an electronic device of a first application example of the exemplary embodiment (1 thereof).

FIG. 15 depicts an electronic device of a first application example of the exemplary embodiment. As shown in FIG. 15, an electronic device 3 of the first application example of the exemplary embodiment has a mounting substrate 50 such as a motherboard at a lower side.

The connection pads P1 are formed on an upper surface of the mounting substrate 50, and a wiring layer 52 is formed on a lower surface. The wiring layer 52 provided on the lower surface is covered with an insulation layer 54. Also, the mounting substrate 50 is formed with an insulation layer 56 having openings 56a provided on the connection pads P1 on the upper surface. The mounting substrate 50 is an example of the lower electronic member.

The Sn/Bi solders 14 of the conductive balls 1 are connected to the connection pads P1 provided on the upper surface of the mounting substrate 50.

Also, a wiring substrate 60 is arranged above the mounting substrate 50 via the conductive balls 1. The wiring substrate 60 has the connection pads P2 provided on both surfaces thereof, and the connection pads P2 provided on both the surfaces are interconnected via through-conductors 62.

The wiring substrate 60 is formed with solder resist layers 64 having openings 64a provided on the connection pads P2 on both the surfaces, respectively. The wiring substrate 60 is an example of the upper electronic member or the lower electronic member.

The connection pads P2 provided on the lower surface of the wiring substrate 60 are connected to the Sn/Bi solders 14 of the conductive balls 1.

The connection structure by the conductive ball 1 shown in FIG. 10 or 14 is applied to a structure where the connection pad P1 of the mounting substrate 50 and the connection pad P2 provided on the lower surface of the wiring substrate 60 are interconnected by the conductive ball 1.

Also, the Sn/Bi solders 14 of the conductive balls 1 are connected to the connection pads P2 provided on the upper surface of the wiring substrate 60. Also, connection pads P3 of a semiconductor chip 70 are connected to the Sn/Bi solders 14 of the conductive balls 1 connected to the wiring substrate 60. Also, an underfill resin 72 is filled at a lower side of the semiconductor chip 70. The semiconductor chip 70 is an example of the upper electronic member.

The connection structure by the conductive ball 1 shown in FIG. 10 or 14 is applied to a structure where the connection pad P2 of the wiring substrate 60 and the connection pad P3 of the semiconductor chip 70 are interconnected by the conductive ball 1.

Figure 16:
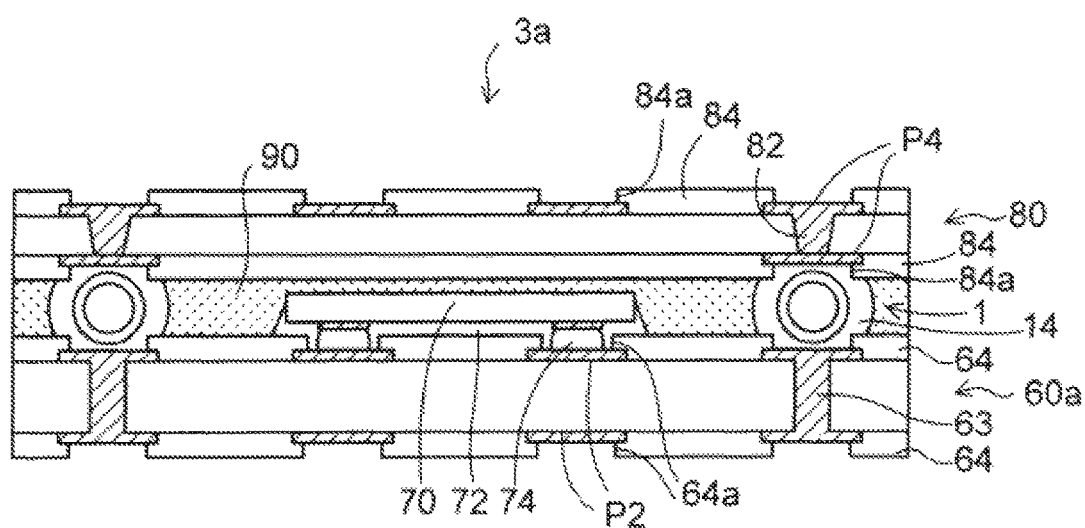
FIG. 16 is a sectional view depicting an electronic device of a second application example of the exemplary embodiment (2 thereof).

FIG. 16 depicts an electronic device of a second application example of the exemplary embodiment. As shown in FIG. 16, in an electronic device 3a of the second application example of the exemplary embodiment, a lower wiring substrate 60a having the same structure as the wiring substrate 60 of FIG. 15 is arranged at a lower side.

The semiconductor chip 70 is flip chip-connected to the connection pads P2 provided on an upper surface of the lower wiring substrate 60a by solder bumps 74. The underfill resin 72 is filled on a lower surface-side of the semiconductor chip 70. The lower wiring substrate 60a is an example of the lower electronic member.

Also, the Sn/Bi solders 14 of the conductive balls 1 are connected to the connection pads P2 provided on the upper surface of the lower wiring substrate 60a.

Also, an upper wiring substrate 80 is arranged above the lower wiring substrate 60a via the conductive balls 1. Connection pads P4 are formed on both surfaces of the upper wiring substrate 80, and the connection pads P4 provided on both the surfaces are interconnected via through-conductors 82.

The upper wiring substrate 80 is formed with solder resist layers 84 having openings 84a provided on the connection pads P4 provided on both the surfaces, respectively.

The connection pads P4 provided on the lower surface of the upper wiring substrate 80 are connected to the Sn/Bi solders 14 of the conductive balls 1. The upper wiring substrate 80 is an example of the upper electronic member. Also, a seal resin 90 is filled between the lower wiring substrate 60a and the upper wiring substrate 80. By the seal resin 90, the semiconductor chip 70 and the conductive balls 1 are sealed.

The connection structure by the conductive ball 1 shown in FIG. 10 or 14 is applied to a structure where the connection pad P2 provided on the upper surface of the lower wiring substrate 60a and the connection pad P4 provided on the lower surface of the upper wiring substrate 80 are interconnected by the conductive ball 1.

This disclosure further encompasses various exemplary embodiments, for example, described below.

1. A manufacturing method of a conductive ball, the manufacturing method comprising:
   preparing a copper ball;
   forming a nickel layer covering an outer surface of the copper ball;
   forming a copper layer covering an outer surface of the nickel layer; and
   forming a tin-based solder covering an outer surface of the copper layer,
   wherein a thickness of the copper layer is adjusted so that copper in the copper layer diffuses into the tin-based solder and a concentration of copper in the tin-based solder becomes 0.7 wt % to 3 wt % when reflow heating the tin-based solder.

2. A manufacturing method of an electronic device, the manufacturing method comprising:
   preparing a lower electronic member, an upper electronic member and a conductive ball, the lower electronic member having a first connection pad, the upper electronic member having a second connection pad, the conductive ball comprising a copper ball, a nickel layer covering an outer surface of the copper ball, a copper layer covering an outer surface of the nickel layer, and a tin-based solder covering an outer surface of the copper layer; and
   interconnecting the first connection pad of the lower electronic member and the second connection pad of the upper electronic member by reflow heating the tin-based solder of the conductive ball,
   wherein a $(Cu, Ni)_6Sn_5$ layer is formed between the nickel layer and the tin-based solder of the conductive ball.

3. The manufacturing method of an electronic device according to claim 2, wherein in the preparation of the conductive ball, a thickness of the copper layer is adjusted so that copper in the copper layer diffuses into the tin-based solder and a concentration of copper in the tin-based solder becomes 0.7 wt % to 3 wt % when reflow heating the tin-based solder.

4. The manufacturing method of an electronic device according to claim 2 or 3, wherein in the interconnection of the first connection pad of the lower electronic member and the second connection pad of the upper electronic member, each surface of the first connection pad and the second connection pad is a nickel layer or a copper layer, and the $(Cu, Ni)_6Sn_5$ layer is respectively formed between the first connection pad and the tin-based solder and between the second connection pad and the tin-based solder.

5. The manufacturing method of an electronic device according to one of claims 2 to 4, wherein the tin-based solder is one of a tin/bismuth solder, a tin/silver solder and a tin/bismuth/nickel solder.

What is claimed is:

1. A conductive ball comprising:
   a copper ball;
   a nickel layer covering an outer surface of the copper ball;
   a copper layer covering an outer surface of the nickel layer, and
   a tin-based solder covering an outer surface of the copper layer,
   wherein a copper weight of the copper layer relative to a summed weight of the tin-based solder and the copper layer is 0.7 wt % to 3 wt %.

2. The conductive ball according to claim 1, wherein a concentration of copper in the copper layer, which is to diffuse into the tin-based solder when the tin-based solder is reflow heated, is 0.7 wt % to 3 wt %.

3. The conductive ball according to claim 1, wherein the tin-based solder is one of a tin/bismuth solder.

4. The conductive ball according to claim 1, wherein the tin-based solder is a tin/silver solder.

5. The conductive ball according to claim 1, wherein the tin-based solder is a tin/bismuth/nickel solder.

6. An electronic device comprising:
   a lower electronic member having a first connection pad;
   an upper electronic member arranged above the lower electronic member and having a second connection pad; and
   a conductive ball configured to interconnect the first connection pad of the lower electronic member and the second connection pad of the upper electronic member,
   wherein the conductive ball comprises:
      a copper ball,
      a nickel layer covering an outer surface of the copper ball, and
      a tin-based solder covering an outer surface of the nickel layer, and
   wherein a $(Cu, Ni)_6Sn_5$ layer is formed between the nickel layer and the tin-based solder.

7. The electronic device according to claim 6, wherein each surface of the first connection pad and the second connection pad is a nickel layer or a copper layer, and
   wherein the $(Cu, Ni)_6Sn_5$ layer is respectively formed between the first connection pad and the tin-based solder and between the second connection pad and the tin-based solder.

8. The electronic device according to claim 7, wherein the tin-based solder is a tin/bismuth solder.

9. The electronic device according to claim 7, wherein the tin-based solder is a tin/silver solder.

10. The electronic device according to claim 7, wherein the tin-based solder is a tin/bismuth/nickel solder.

11. The electronic device according to claim 6, wherein the tin-based solder is a tin/bismuth solder.

12. The electronic device according to claim 6, wherein the tin-based solder is a tin/silver solder.

13. The electronic device according to claim 6, wherein the tin-based solder is a tin/bismuth/nickel solder.

* * * * *